United States Patent [19]

Ito

[11] Patent Number: 4,539,712
[45] Date of Patent: Sep. 3, 1985

[54] DELAY CIRCUIT

[75] Inventor: Tatsuo Ito, Kobe, Japan

[73] Assignee: Fujitsu-Ten, Ltd., Kobe, Japan

[21] Appl. No.: 187,842

[22] PCT Filed: Jan. 30, 1979

[86] PCT No.: PCT/JP79/00023
§ 371 Date: Sep. 24, 1979
§ 102(e) Date: Sep. 24, 1979

[87] PCT Pub. No.: WO79/00564
PCT Pub. Date: Aug. 23, 1979

[30] Foreign Application Priority Data

Jan. 30, 1978 [JP] Japan ............... 53-9962[U]

[51] Int. Cl.³ ............................. H04B 1/16
[52] U.S. Cl. .................... 455/184; 455/185
[58] Field of Search ............ 307/247 R, 593; 455/184, 185

[56] References Cited

U.S. PATENT DOCUMENTS 3,226,568 12/1965 Samwel .................. 307/247 R
3,576,496 4/1971 Garagnon ............... 307/247 R
4,052,676 10/1977 Crittenden ............... 328/129
4,419,769 12/1983 Cohen ....................... 455/184

OTHER PUBLICATIONS

*IBM Technical Disclosure Bulletin*, vol. 16, No. 6, Nov. 1973, "Digital Delay Circuit", by P. A. Kuckein.

*Primary Examiner*—John S. Heyman
*Attorney, Agent, or Firm*—Oblon, Fisher, Spivak, McClelland & Maier

[57] ABSTRACT

A delay circuit is disclosed having (32, 34), a flip-flop circuit (36), and circuits (30, 40) for maintaining reset states during the presence of a first signal (Xo, Yo) and a gate circuit (38) inputted with a second signal (Sd) and controlled to open and close by the output from the flip-flop circuit, and capable of obtaining a relatively long time of delay from the end of the first signal to the interruption of the output of the second signal, with ease in a digital manner even if produced as an integrated circuit. The delay circuit is suitable for use with the channel selection circuit in electronic tuning radio receivers.

4 Claims, 6 Drawing Figures

DELAY CIRCUIT

FIELD OF INVENTION

This invention concerns a digital delay circuit changing the state of output at a predetermined of time after the elimination of input signals.

BACKGROUND OF INVENTION

Delay circuits or timer circuits changing the state of output at a predetermined period of time after the elimination of input signals are employed in various control circuits and a typical circuit of this kind in the prior art is an integration circuit using a resistor 12 and a capacitor 14 as shown in FIG. 1. When continuous pulse waves 22 are inputted from an input terminal 10 in this circuit, each of the pulse waves is smoothed as shown by a waveform 24 through an integration circuit composed of the resistor 12 and the capacitor 14 and shaped in a buffer amplifier 18, and the waveform 26 outputted from an output terminal 20 forms a continuous waveform, that is, a rectangular wave 26. Since the output waveform takes a "1" level during input of the pulse waves 22 and turns to a "0" level at a time $\Delta t$ after the input of the pulse waves have been interrupted, a gate can be opened or closed after the elapse of the time $\Delta t$ from the interruption of the input by controlling the gate with the output.

If such a delay circuit is intended to be fabricated as an integrated circuit, however, it is difficult to set a time constant, accordingly, the delay time t to the order of milliseconds or more since the capacitance value of a capacitor that can be realized in an integrated circuit is limited only to several picofarads.

SUMMARY OF THE INVENTION

This invention has been made for overcoming the disadvantage of the prior art and an object thereof is to provide a delay circuit capable of affording a sufficient delay time even when it is fabricated as an integrated circuit.

Another object of this invention is to provide a delay circuit capable of changing the length of the delay time optionally in a digital manner.

The delay circuit according to this invention is composed of an RS flip-flop and a counter which are held at reset states while input signals are present, with the reset states being clock signals counted by the counter when the input signals cease with the flop-flop being set by the output of the counter which is issued when a predetermined counting value corresponding to a desired delay time has been attained and opening or closing a gate with the output thereof. Since this delay circuit requires no capacitor of great capacity, it can be fabricated with ease as an integrated circuit and the length of the delay time can optionally be varied only by the changes in the counting value of the counter.

Other objects, constructions and advantages of this invention will be made clearer by the following descriptions referring to the accompanying drawings.

BEST MODE FOR PRACTICING INVENTION

Figure 1:
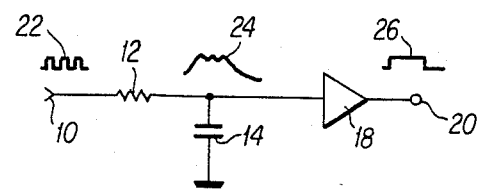
FIG. 1 is a circuit diagram showing an example of typical conventional delay circuits.
Figure 2:
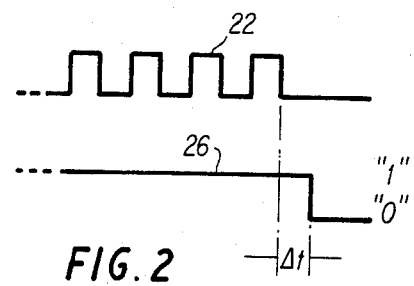
FIG. 2 is a waveform chart for explaining the operation of the circuit in FIG. 1.
Figure 3:
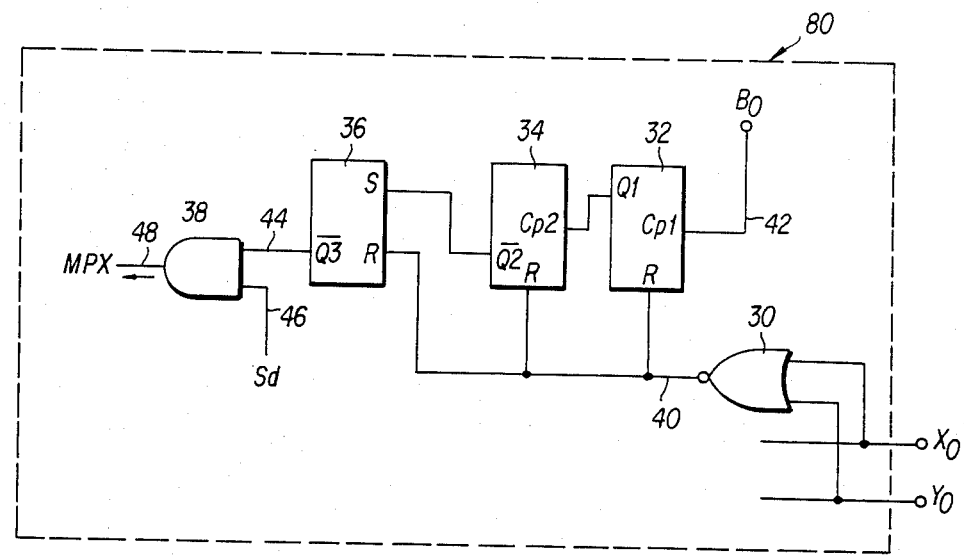
FIG. 3 is a block diagram showing one embodiment of a delay circuit according to this invention.

Referring to FIG. 3, a NOR circuit 30 to be supplied with signals Xo, Yo, a flip-flop circuit 32 supplied at its input terminal $Cp_1$ with clock signals Bo by way of a lead 42, a flip-flop circuit 34 to be supplied at its input terminal $Cp_2$ with the Q output from the flip-flop circuit 32 are shown in the figure and these circuits constitute a counter. 36 is an RS (set-reset) flip-flop circuit supplied with the output of the above counter, and 38 is an AND circuit supplied with at its one input terminal with the $\overline{Q}$ output from the flip-flop circuit 36 by way of a lead 44 and at the other input terminal with a signal Sd described later by way of a lead 46. A multiplexer 62 or the like to be described later is connected by way of a lead 48 to the output of the circuit 38. The output from the NOR circuit 30 is inputted by way of a lead 40 to reset terminals R of the flip-flop circuits 32, 34, 36.

Figure 4:
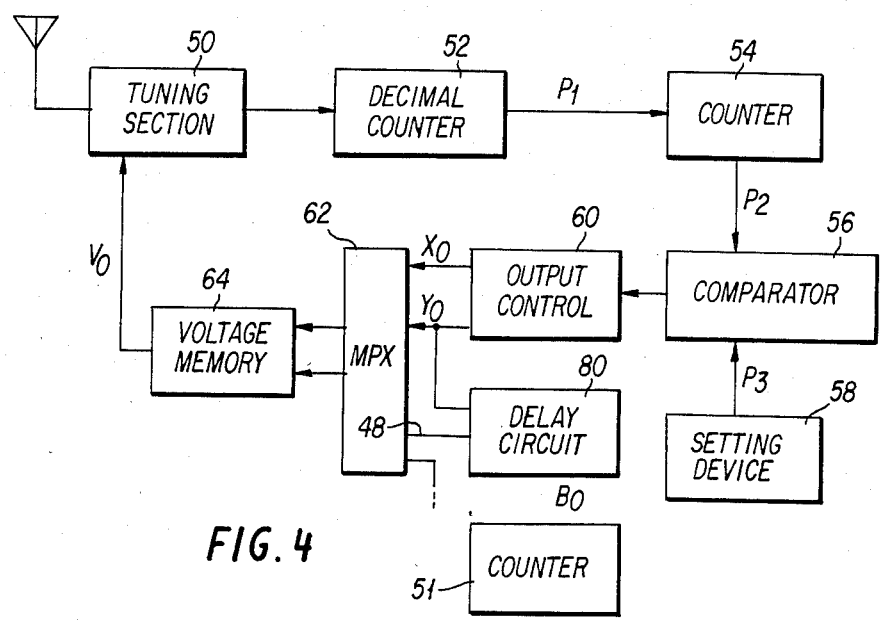
FIG. 4 is a block diagram showing the construction of an application of the delay circuit according to this invention.

The delay circuit in this embodiment is used in an automatic electronic channel selection radio receiver for use in vehicles. In the automatic electronic channel selection radio receiver, an audience can take several means for executing channel selection. They include a digital channel selection system adapted to store, in a memory, those values corresponding to the transmitting frequency for each of the broadcasting stations and designate a desired value among them to thereby execute the channel selection, a search channel selection system adapted to continuously change the receivable frequency by way of an electronic sweeping to thereby select each of the broadcasting channels successively in the broadcasting frequency band, a manual channel selection system adapted to manually change the receivable frequency by the on-off operation of switches to thereby execute the channel selection, or the like, and the applicant has already filed such patent applications for each of the above systems such as the Japanese Patent Applications Nos. 39648/1976, 40024/1976 and 129831/1976. Referring to FIG. 4, the local oscillation frequency taken out from a tuning section 50 in a radio receiver is sampled at first and divided into 1/10 in frequency by a decimal counter 52 to obtain one pulse $P_1$ on every 10 KHz in case of AM and on every 100 KHz in case of FM. The pulses are counted in a counter 54 to which an appropriate number has been preset, to obtain binary codes $P_2$: which is 000 . . . 0 at the beginning of each of the AM and FM broadcasting frequency bands and increases thereafter by one on every 30 KHz in case of AM and on every 400 KHz in case of FM. Since the frequency for each of the broadcasting stations is set on 10 KHz unit for AM and on 100 KHz unit for FM and the frequency for each of the broadcasting station is properly aparted from each other in a same district, it is generally possible to represent the frequency for each of the broadcasting stations by one of the above binary codes $P_2$. The same codes as above binary codes $P_2$ are previously written into the read only memory in a digital setting device 58 and one code $P_3$ among them corresponding to a desired broadcasting station is read out by the switching operation and inputted to a comparator 56 upon channel selection. The comparator 56 compares these codes P₂ and P₃ and outputs, by way of an output control section 60, signals Xo, Yo instructing upwarding (if $P_2 < P_3$) or downwarding (if $P_2 > P_3$) of the receiving frequency. The signals Xo, Yo are inputted, by way of a multiplexer 62 for selecting one of various channel selection modes, into a voltage memory device 64 to instruct gradual increase or gradual decrease in its output voltage Vo. The voltage memory device 64 is basically composed of an integration circuit, which integrates a positive or a negative input voltage to gradually increase or decrease its output voltage and stops the change in the output voltage when the input voltage becomes zero and continues to output the voltage value at that time for a long period of time. The output voltage Vo is applied to a voltage variable capacitance diode (not shown) in the tuning section 50 to vary its capacitance value and thereby increase or decrease the tuning frequency, accordingly, the receiving (receivable) frequency. If the receiving frequency coincides with the frequency of a desired broadcasting station, the relation: $P_2 = P_3$ is attained, in which both of the signals Xo, Yo take an L (low) level and the changes in the output voltage Vo in the voltage memory device 64 is interrupted, where the radio enters a receiving state.

The digital channel selection has thus been completed and the output voltage from an automatic frequency control circuit (not shown) is applied in the receiving state to the above voltage variable capacitance diode by way of the multiplexer 62 or the like to finely control the receiving frequency automatically thereby enabling the reception always under the best condition. It is desired to transfer from the completion of the digital channel selection to the AFC receiving state or other channel selection states with a certain delay, and the delay circuit shown in FIG. 3 is used for such application.

Figure 5:
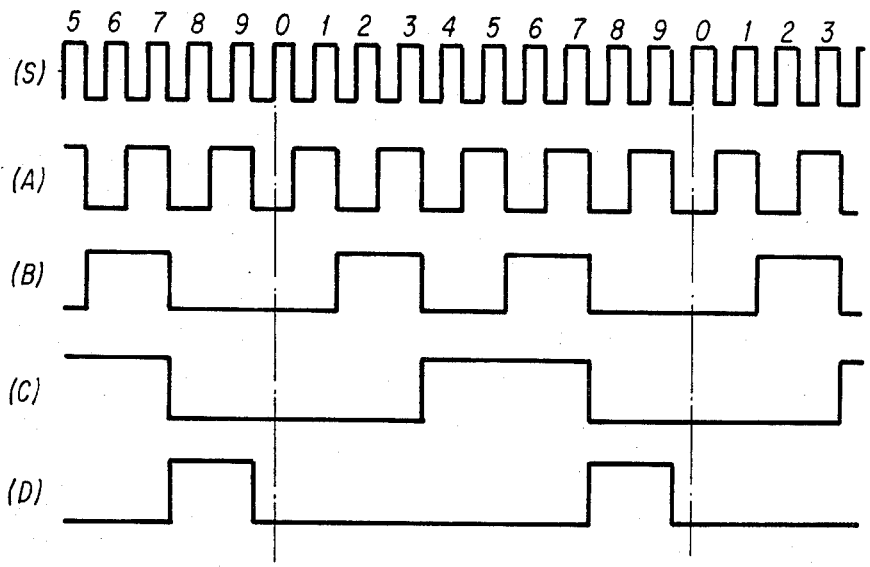
FIG. 5 and FIG. 6 are waveform charts for explaining the operation of the circuit in FIG. 3.
Figure 6:
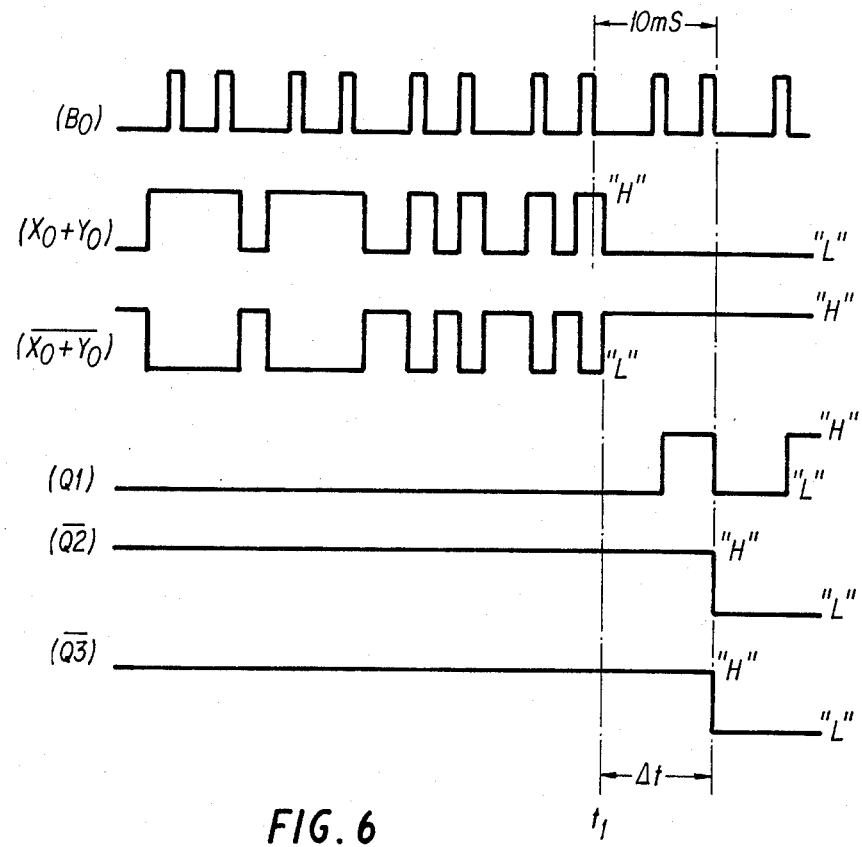

The operation of the circuit shown in FIG. 3 will be explained in conjunction with the time charts shown in FIG. 5 and FIG. 6. Clock signals Bo are inputted to the input terminal Cp₁ of the flip-flop circuit 32, and the signal Bo is a "B" output from a decimal counter such as a counter 52 in FIG. 4 and has a waveform as shown in FIG. 5. In FIG. 5, (S) is an input signal for the counter 52, and (A), (B), (C), (D) are output waveforms of the counter at each of the output stages A-D corresponding to $2^0, 2^1, 2^2, 2^3$. Although the signal Bo is inputted to the counter constructed by the flip-flop circuits 32, 34, since the output from the NOR circuit 30 remains an L level while either one of the signals Xo, Yo is at a H (high) level and the L level is inputted by way of the lead 40 to the reset terminals R, the counters 32, 34 are kept reset and do not execute counting. Since the L level output from the NOR circuit 30 is also applied to the flip-flop circuit 36 to reset it, its $\overline{Q}$ output takes a H level as shown in FIG. 6 (Q₃), which is inputted by way of the lead 44 to one of the input terminals of the AND circuit 38. Since the signal Sd which turns to the H level during the digital channel selection is inputted to the other input terminal of the AND circuit 38, the output from the circuit 38 turns to the H level, which is inputted to the above multiplexer 62 to switch the channel selection circuit into the digital channel selection mode.

The signals Xo, Yo take the H level and the L level alternately from each other and take the form of a rectangular wave as shown in FIG. 6 ($\overline{Xo + Yo}$) which has a greater duty ratio when the receiving frequency is greatly aparted from the set frequency and has a smaller duty ratio when both of the frequencies are closed to each other. Such a waveform shaping is performed with the aim of changing the channel selection speed in accordance with the degree of aparture from tuning or furnishing a time required for sampling and counting or the like, and such a procession is executed in the output control selection 60 shown in FIG. 4. Consequently, while the reset and the release of the reset for the flip-flop circuits 32, 34 are executed repeatedly, they are surely reset at the time of input of the clocks Bo and the Q output of the flip-flop circuit 32 and the $\overline{Q}$ output from the flip-flop circuit 34 remain at the L level and the H level respectively as shown in (Q₁), ($\overline{Q_2}$) in FIG. 6 during the presence of the signals Xo, Yo as can be seen from FIG. 6.

Then when both of the signals Xo, Yo take the L level under the relation $P_2 = P_3$ at a time t1, the output from the NOR circuit 30 turns to the H level as shown in FIG. 6 (Xo+Yo) to release the reset state for the flip-flop circuit 32, 34. Then, the counters 32, 34 start to count the clock signals Bo, in which Q output Q₁ from the flip-flop circuit 32 turns to the H level at the arrival of the first clock, the output Q₁ turns to the L level upon input of the next clock and the outputs $\overline{Q_2}$, $\overline{Q_3}$ of the flip-flop circuit 34, 36 turn to the L level to turn the output from the AND circuit 38 to the L level. In this way, the digital channel selection is interrupted at 2 clocks, i.e., $\Delta t = 10$ mS in time after the elimination of the signals Xo, Yo in this embodiment and switched to the receiving state under the AFC control in this embodiment. A greater delay can of course be furnished in this switching in accordance with the increase in the number set of the counters 32, 34, that is, in the number of the clocks from the release for the reset to issue of the counter output.

According to this invention, a digital delay or timer circuit using no capacitor of great capacitance and hence very advantageous for fabrication as an integrated circuit can thus be obtained. This invention is no way limited to the illustrated embodiment and various modifications are possible within the scope of the claim.

I claim:

1. An integrated digital delay circuit for use in an automatic channel selecting radio receiver having an output control signal for the increase or decrease of the tuning section frequency in response to a digital comparison of the measured tuning section frequency and a preselected digital frequency wherein said integrated digital delay circuit is provided in order to delay an automatic switching from a digital channel selection mode to one of a receiving mode or another channel selection mode upon the cessation of said output control signal and wherein said digital delay circuit comprises:

a counter having a cascade connection of a plurality of flip-flop circuits;

a separate flip-flop circuit which is set by the output from said counter when said counter reaches a predetermined number;

a gating circuit being fed by said output control signal and which outputs a signal for maintaining said counter and said flip-flop circuits in their reset states when said output control signal is in a first state; and a second gating circuit which is inputted with a digital channel selection indication signal and is controlled by the output from said separate flip-flop circuit in order to provide switching from a digital channel selection mode to one of a receiving mode or another channel selection mode a predetermined time after the cessation of said output control signal.

2. The integrated digital delay circuit of claim 1 wherein said first gate circuit is a NOR circuit and wherein said output control signal is one of an upward or a downward instruction signal corresponding to the increase or decrease of the tuning section frequency in response to said digital comparison.

3. The digital delay circuit of claim 1 or 2 wherein said second gate circuit is an AND circuit.

4. The integrated digital delay circuit of claim 1 wherein said counter counts the output of a clocking circuit.

* * * * *

UNITED STATES PATENT AND TRADEMARK OFFICE
CERTIFICATE OF CORRECTION

PATENT NO. : 4,539,712
DATED : September 3, 1985
INVENTOR(S) : TATSUO ITO

It is certified that error appears in the above-identified patent and that said Letters Patent is hereby corrected as shown below:

Title page:

In the abstract, line 1, after "having" insert --counters--;
Column 1, line 7, after "predetermined" insert --period--.

Signed and Sealed this

Twenty-sixth Day of August 1986

[SEAL]

Attest:

DONALD J. QUIGG

Attesting Officer

Commissioner of Patents and Trademarks